US009166859B2

(12) United States Patent
Saito et al.

(10) Patent No.: US 9,166,859 B2
(45) Date of Patent: Oct. 20, 2015

(54) WIRELESS COMMUNICATION APPARATUS AND TRANSMISSION POWER CONTROL METHOD (71) Applicant: Panasonic Corporation, Osaka (JP)

(72) Inventors: Noriaki Saito, Tokyo (JP); Kenji Miyanaga, Kanagawa (JP); Takayuki Tsukizawa, Kanagawa (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/390,896

(22) PCT Filed: Dec. 26, 2013

(86) PCT No.: PCT/JP2013/007659
§ 371 (c)(1),
(2) Date: Oct. 6, 2014

(87) PCT Pub. No.: WO2014/122718
PCT Pub. Date: Aug. 14, 2014

(65) Prior Publication Data
US 2015/0163086 A1    Jun. 11, 2015

(30) Foreign Application Priority Data

Feb. 8, 2013    (JP) ................................. 2013-023451

(51) Int. Cl.
*H04L 25/49*        (2006.01)
*H04L 27/36*        (2006.01)
(Continued)

(52) U.S. Cl.
CPC ............ *H04L 27/362* (2013.01); *H03G 3/3042* (2013.01); *H04L 27/3405* (2013.01); *Y02B 60/50* (2013.01)

(58) Field of Classification Search
CPC .................... H04B 2001/0416; H03G 3/3047; H03G 3/001; H03G 3/20; H03G 3/301; H03G 1/02
USPC .................. 375/295, 296, 297; 330/278, 282; 455/127.1, 127.2
See application file for complete search history.

(56) References Cited

U.S. PATENT DOCUMENTS 4,291,410 A * 9/1981 Caples et al. ................. 375/345
5,732,334 A * 3/1998 Miyake ......................... 455/126
(Continued)

FOREIGN PATENT DOCUMENTS

JP        08-265210 A    10/1996
JP        2001-086010 A    3/2001
(Continued)

OTHER PUBLICATIONS

International Search Report for Application No. PCT/JP2013/007659 dated Apr. 8, 2014.

*Primary Examiner* — Tesfaldet Bocure
(74) *Attorney, Agent, or Firm* — Pearne & Gordon LLP (57) ABSTRACT A variable gain amplifier amplifies a baseband signal. A quadrature modulator quadrature-modulates the amplified baseband signal to generate a high-frequency signal. A power amplifier amplifies the generated high-frequency signal. An antenna transmits the amplified high-frequency signal. A detector detects the amplified high-frequency signal. A first nonvolatile memory stores the desired transmission power of the high-frequency signal to be transmitted from the antenna. A controller adjusts the gain of the variable gain amplifier depending on the output of the detector and the transmission power stored in the first nonvolatile memory.

3 Claims, 7 Drawing Sheets (51) Int. Cl.
*H03G 3/30* (2006.01)
*H04L 27/34* (2006.01)

(56) References Cited

U.S. PATENT DOCUMENTS

| | | | |
|---|---|---|---|
| 6,292,120 B1 * | 9/2001 | Painchaud et al. | 341/139 |
| 6,591,089 B1 | 7/2003 | Ichihara | |
| 6,721,368 B1 | 4/2004 | Younis et al. | |
| 7,808,322 B1 * | 10/2010 | Son et al. | 330/278 |
| 8,085,869 B2 * | 12/2011 | Behzad | 375/297 |
| 2010/0027596 A1 * | 2/2010 | Bellaouar et al. | 375/219 |

FOREIGN PATENT DOCUMENTS

| | | |
|---|---|---|
| JP | 2008-245058 A | 10/2008 |
| JP | 2009-044470 A | 2/2009 |
| JP | 2010-021747 A | 1/2010 |
| JP | 2012-016027 A | 1/2012 |

* cited by examiner

WIRELESS COMMUNICATION APPARATUS AND TRANSMISSION POWER CONTROL METHOD

TECHNICAL FIELD

The present disclosure relates to a wireless communication apparatus and a transmission power control method for controlling the transmission power of a high-frequency signal.

In recent years, as the micro-fabrication technology in CMOS (Complementary Metal Oxide Semiconductor) processes advances, integrated circuits for millimeter wave wireless communication using, for example, a 60 GHz band, have been put into practical use. The operating frequency of such an integrated circuit for millimeter wave band wireless communication is higher than the operating frequency of an integrated circuit for microwave band wireless communication, thereby becoming the high cutoff frequency ft in a CMOS process; in other words, the current gain becomes one time; hence, the difference between the frequency at which the integrated circuit is difficult to be used as an amplifying element and the operating frequency thereof decreases, whereby the two frequencies are close to each other.

For this reason, the gain of an amplifier for high-frequency signals varies significantly due to variation in a CMOS process and temperature change. Furthermore, since variation in antenna gain is apt to occur in millimeter wave band wireless communication, there has been a problem that the EIRP (Effective Isotropic Radiated Power) of an antenna in a wireless communication apparatus is apt to vary.

To solve this problem, a wireless communication apparatus for correcting the deviation of transmission power due to variation in the process using a nonvolatile memory has been known conventionally (for example, refer to Patent Document 1). The operation of the wireless communication apparatus disclosed in Patent Document 1 will be described later referring to FIGS. 6 and 7.

PRIOR ART DOCUMENT

Patent Document

Patent Document 1: JP-A-8-265210

SUMMARY OF THE INVENTION

Problem That the Invention Is to Solve

However, in Patent Document 1, in the case that variation occurs in antenna gain, correcting the power of a high-frequency signal is not considered. For this reason, in wireless communication (for example, millimeter wave wireless communication) in which variation is apt to occur in antenna gain, there occurs a problem that it is difficult to make the EIRP of the antenna in the wireless communication apparatus constant.

In order to solve the above-mentioned conventional problem, the present disclosure is intended to provide a wireless communication apparatus and a transmission power control method for making the EIRP of an antenna constant even if variation occurs in antenna gain in wireless communication dealing with high-frequency signals.

Means for Solving the Problem

The present disclosure provides a wireless communication apparatus equipped with a variable gain amplifier that amplifies a baseband signal; a quadrature modulator that quadrature-modulates the amplified baseband signal to generate a high-frequency signal; a power amplifier that amplifies the generated high-frequency signal; an antenna that transmits the amplified high-frequency signal; a detector that detects the amplified high-frequency signal; a first nonvolatile memory that stores the desired transmission power of the high-frequency signal to be transmitted from the antenna; and a controller that adjusts the gain of the variable gain amplifier depending on the output of the detector and the transmission power stored in the first nonvolatile memory.

In addition, the present disclosure provides a transmission power control method for use in a wireless communication apparatus for transmitting a high-frequency signal from an antenna and in a tester for testing the transmission power of the high-frequency signal transmitted from the antenna, wherein the wireless communication apparatus has a first nonvolatile memory for storing the initial value of the transmission power of the high-frequency signal to be transmitted from the antenna and a second nonvolatile memory, and the tester stores the desired range of the transmission power of the high-frequency signal to be transmitted from the antenna, adjusts the gain of variable gain amplifiers so that the output of the tester is equal to the transmission power stored in the first nonvolatile memory, and then, in the case that the transmission power of the high-frequency signal transmitted from the antenna is larger than an upper limit value in the desired range of the transmission power, writes a difference between the transmission power of the high-frequency signal and a predetermined value in the desired range of the transmission power in the second nonvolatile memory.

Advantage of the Invention

With the present disclosure, in wireless communication dealing with high-frequency signals, the EIRP of an antenna can be made constant even if the gain of the antenna varies.

MODE FOR CARRYING OUT THE INVENTION

Background to Contents of Embodiments of Disclosure

Figure 6:
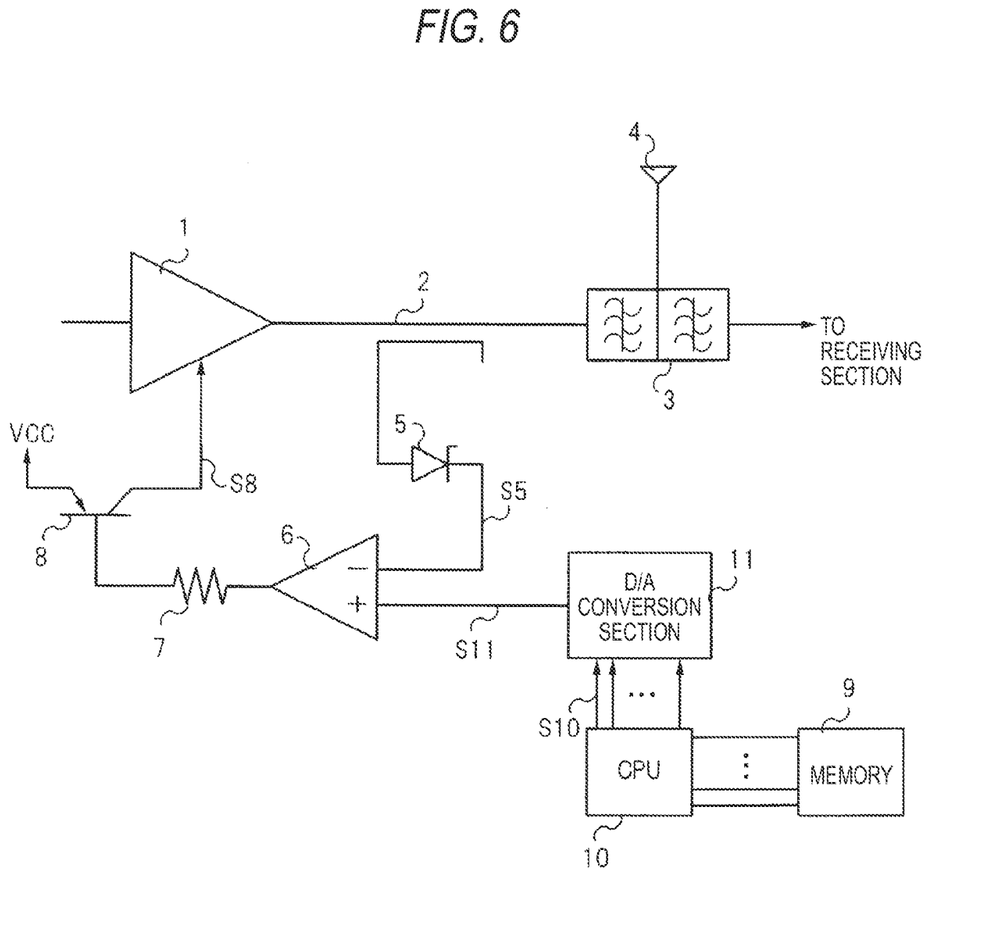
FIG. 6 is a block diagram showing part of the conventional wireless communication apparatus.
Figure 7:
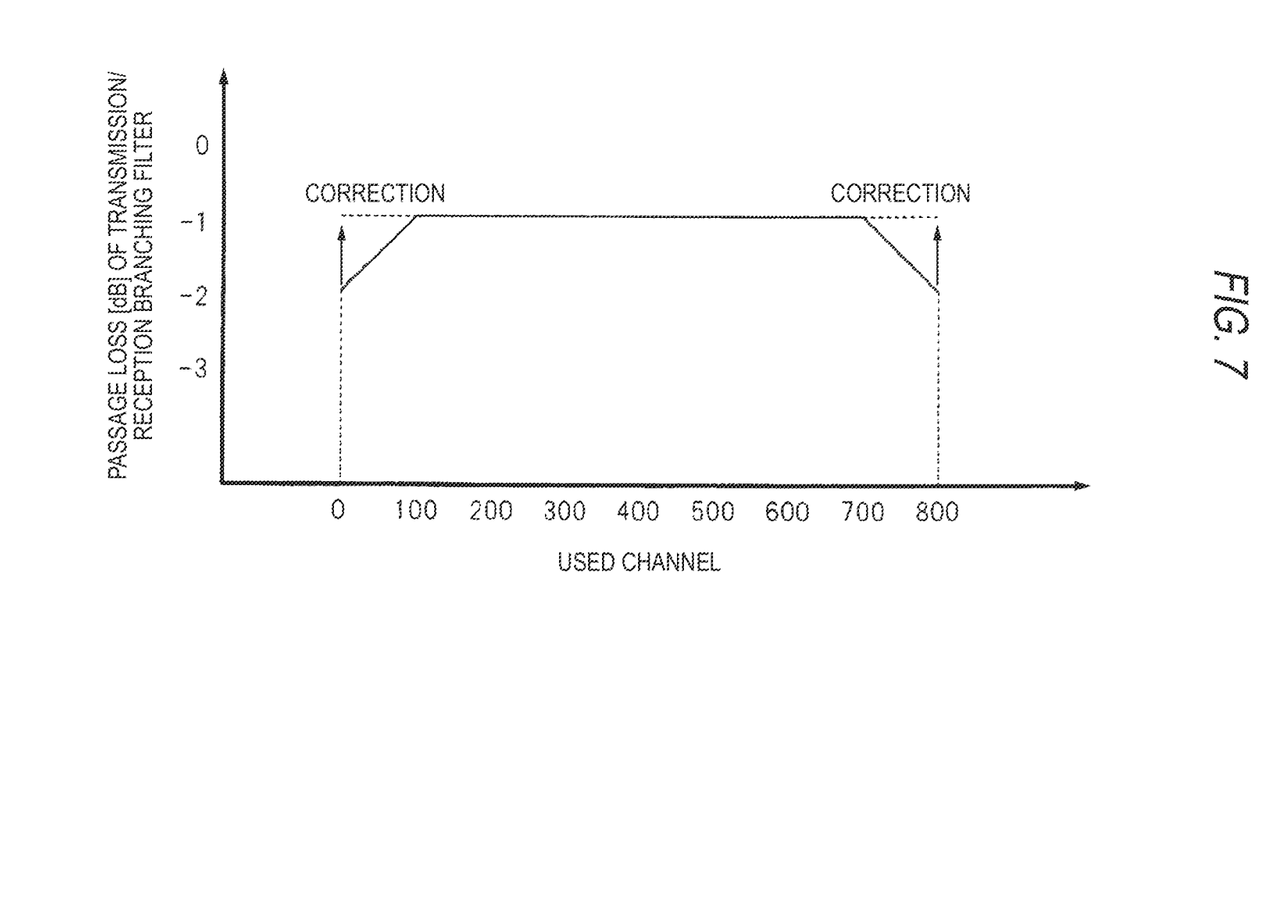
FIG. 7 is a graph showing the relationship between a used channel and the passage loss of a transmission/reception branching filter in the conventional wireless communication apparatus.

Before the description of a wireless communication apparatus and a transmission power control method according to an embodiment of the present disclosure, first, circumstances leading to the contents of this embodiment will be described referring to FIGS. 6 and 7. FIG. 6 is a block diagram showing part of the conventional wireless communication apparatus (refer to Patent Document 1). FIG. 7 is a graph showing the relationship between a used channel and the passage loss of a transmission/reception branching filter in the conventional wireless communication apparatus (refer to Patent Document 1).

In the wireless communication apparatus shown in FIG. 6, a transmission/reception branching filter 3 is connected via a directional coupler 2 to the output terminal of a power amplifier 1 for amplifying the electric power of a transmission signal modulated in a transmission section (not shown), and an antenna 4 is connected to one terminal of the transmission/reception branching filter 3 and a receiving section (not shown) is connected to the other terminal of the transmission/reception branching filter 3.

The power amplifier 1 can change its output power depending on the control signal S8 given to its power control terminal. The directional coupler 2 detects the output power of the power amplifier 1. A detection diode 5 for detecting the output power of the power amplifier 1 as a DC voltage (a detection signal S5) is connected to the directional coupler 2. The directional coupler 2 and the detection diode 5 operate as power detecting means for detecting the output power of the power amplifier 1 and outputting the detection signal S5.

An operational amplifier 6 compares the detection signal S5 output from the detection diode 5 and a reference signal S11 and changes the value of the detection signal S5 so that the level difference between the two signals, obtained as the result of the comparison, becomes zero. Furthermore, the wireless communication apparatus shown in FIG. 6 is provided with a memory 9 in which output control data corresponding to the power level to be output from the output terminal of the antenna 4 is stored.

In other words, depending on the relationship between the used channel and the passage loss of the transmission/reception branching filter 3 shown in FIG. 7, the output control data indicating the relationship between the used channel and the output power to be output from the output terminal of the antenna 4 is stored in the memory 9. The passage loss of power occurs due to the directional coupler 2 and the transmission/reception branching filter 3 between the output terminal of the power amplifier 1 and the output terminal of the antenna 4.

For example, the passage loss of the transmission/reception branching filter 3 shown in FIG. 7 is 2 dB at the used channels 0 to 100, 1 dB at the used channels 100 to 700, and 2 dB at the used channels 700 to 800. Hence, a correction value of 1 dB is required to be added at the used channels 0 to 100 and 700 to 800 to make the passage loss of the transmission/reception branching filter 3 constant. On the basis of the output control data, the wireless communication apparatus maintains the output power levels of all the used channels at the output terminal of the antenna 4 constant.

However, in the case that Patent Document 1 is applied to wireless communication in the millimeter wave band having a wide band width, the operating range of a detector (for example, a detection diode) for detecting the power of a high-frequency signal becomes insufficient; hence, the output voltage of the detector with respect to the input power thereof is not determined uniquely, and it becomes difficult to control the signal power of the high-frequency signal constant.

Moreover, although it is possible to virtually expand the operating range of the detector by mounting detectors having different operating ranges in parallel, variation among the respective detectors is large in wireless communication dealing with high-frequency signals (in particular, 60 GHz millimeter wave band wireless communication), and the detectors are required to be calibrated individually, which is not preferable.

Hence, in the following respective embodiments, examples of a wireless communication apparatus and a transmission power control method for making the EIRP of an antenna constant using a simple configuration even if variation occurs in antenna gain in wireless communication dealing with high-frequency signals are described.

Specific embodiments of the wireless communication apparatus and the transmission power control method according to the present disclosure will be described below referring to the drawings. The transmission power control method according to the present disclosure is carried out by the wireless communication apparatus according to the present disclosure. First, the configuration of the wireless communication apparatus will be described.

Configuration of the Wireless Communication Apparatus

Figure 1:
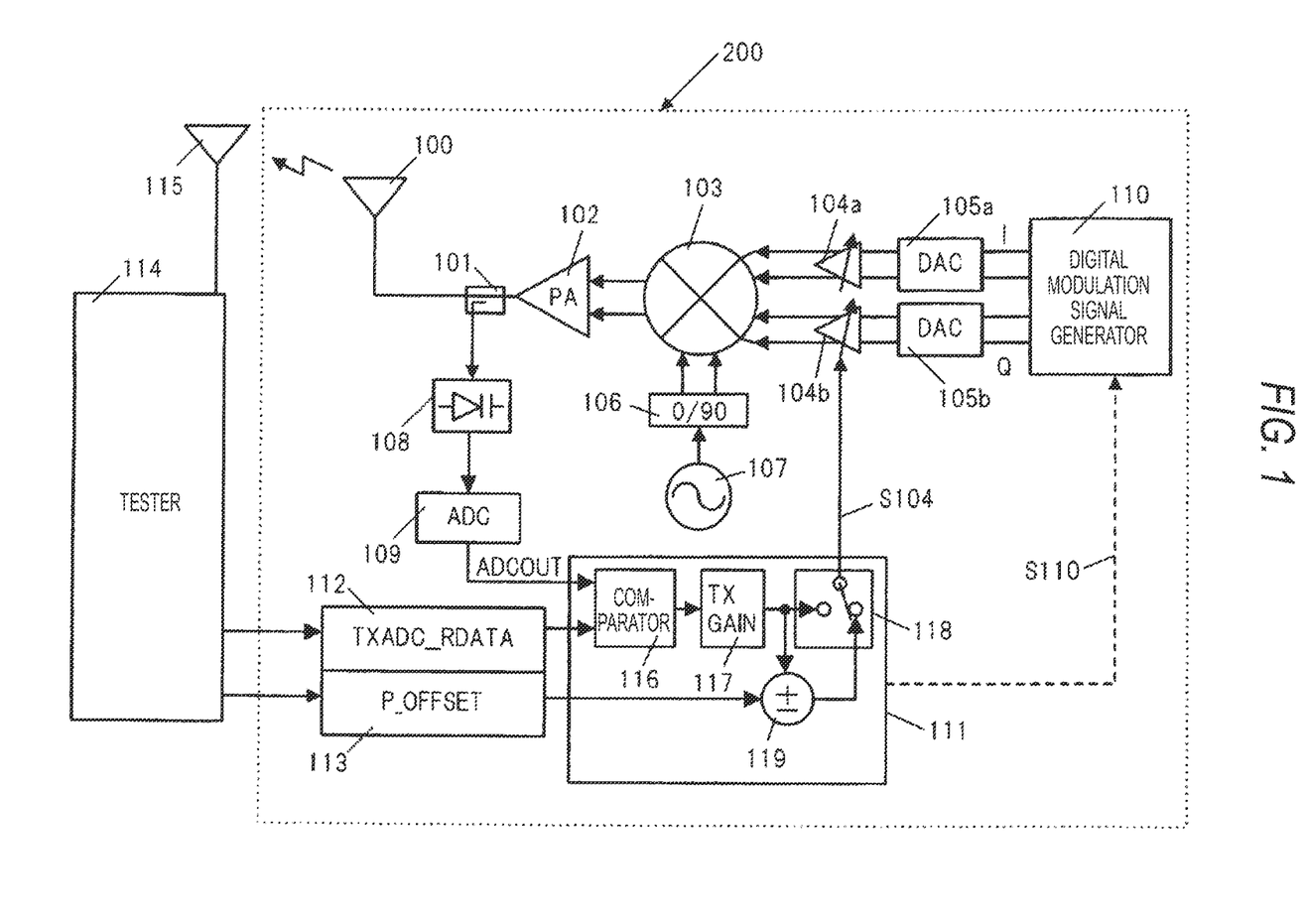
FIG. 1 is a block diagram showing the configuration of a wireless communication apparatus according to this embodiment.

FIG. 1 is a block diagram showing the configuration of a wireless communication apparatus 200 according to this embodiment. The wireless communication apparatus 200 shown in FIG. 1 includes a digital modulation signal generator 110, DACs (Digital Analog Converters) 105a and 105b, variable gain amplifiers 104a and 104b, a quadrature modulation section 103, a power amplifier 102, a local oscillator 107, a 90-degree phase shifter 106, a coupler 101, a transmission antenna 100, a detector 108, an ADC (Analog Digital Converter) 109, a controller 111, a first nonvolatile memory 112, and a second nonvolatile memory 113. The controller 111 includes a comparator 116, a volatile memory 117, a switch 118, and a subtractor 119.

The wireless communication apparatus 200 according to this embodiment generates a high-frequency signal having a millimeter wave band frequency, for example, approximately 60 GHz, and transmits the signal from the transmission antenna 100. A tester 114 receives the high-frequency signal transmitted from the transmission antenna 100 using a receiving antenna 115. Although differential signals are output from the digital modulation signal generator 110, the DACs 105a and 105b, and the variable gain amplifiers 104a and 104b and then input to the quadrature modulation section 103 in FIG. 1, a single end signal may be input.

The digital modulation signal generator 110 generates baseband signals (for example, testing tone signals) having the same amplitude and a phase difference of 90-degrees, outputs the in-phase signal (I signal) of the baseband signals to the DAC 105a, and outputs the quadrature signal (Q signal) of the baseband signals to the DAC 105b. The digital modulation signal generator 110 may generate the output levels of the baseband signals (for example, the testing tone signals) on the basis of the control signal S110 output from the controller 111.

The DAC 105a converts the digital in-phase signal output from the digital modulation signal generator 110 into an analog in-phase signal and outputs the signal to the variable gain amplifier 104a.

The DAC 105b converts the digital quadrature signal output from the digital modulation signal generator 110 into an analog quadrature signal and outputs the signal to the variable gain amplifier 104b.

The variable gain amplifier 104a changes its gain depending on the gain control signal S104 output from the controller 111, amplifies the in-phase signal output from the DAC 105a using the gain changed depending on the gain control signal S104, and outputs the amplified signal to the quadrature modulation section 103. The indication of an arrow from the controller 111 to the variable gain amplifier 104a is omitted to simplify FIG. 1.

The variable gain amplifier 104b changes its gain depending on the gain control signal S104 output from the controller 111, amplifies the quadrature signal output from the DAC 105b using the gain changed depending on the gain control signal S104, and outputs the amplified signal to the quadrature modulation section 103.

The local oscillator 107 oscillates and generates a predetermined (for example, 60 GHz) local signal and outputs the signal to the 90-degree phase shifter 106.

Using the local signal output from the local oscillator 107, the 90-degree phase shifter 106 generates two local signals having the same amplitude and a phase difference of 90-degrees and outputs the signals to the quadrature modulation section 103.

The quadrature modulation section 103 performs quadrature modulation using the baseband signals (the in-phase signal and the quadrature signal) output from the variable gain amplifiers 104a and 104b and the two local signals output from the 90-degree phase shifter 106. The quadrature modulation section 103 generates a high-frequency signal (for example, a millimeter wave) by quadrature modulation and outputs the signal to the power amplifier 102.

The power amplifier (PA) 102 amplifies the power of the high-frequency signal output from the quadrature modulation section 103 and outputs the amplified signal to the transmission antenna 100. The high-frequency signal input to the transmission antenna 100 is transmitted and received by the receiving antenna 115 of the tester 114.

The coupler 101 extracts part of the high-frequency signal amplified by the power amplifier 102 and outputs the part to the detector 108. The power of the analog high-frequency signal extracted by the coupler 101 is lower than the power of the high-frequency signal amplified by the power amplifier 102 by 20 dB, for example.

Figure 2:
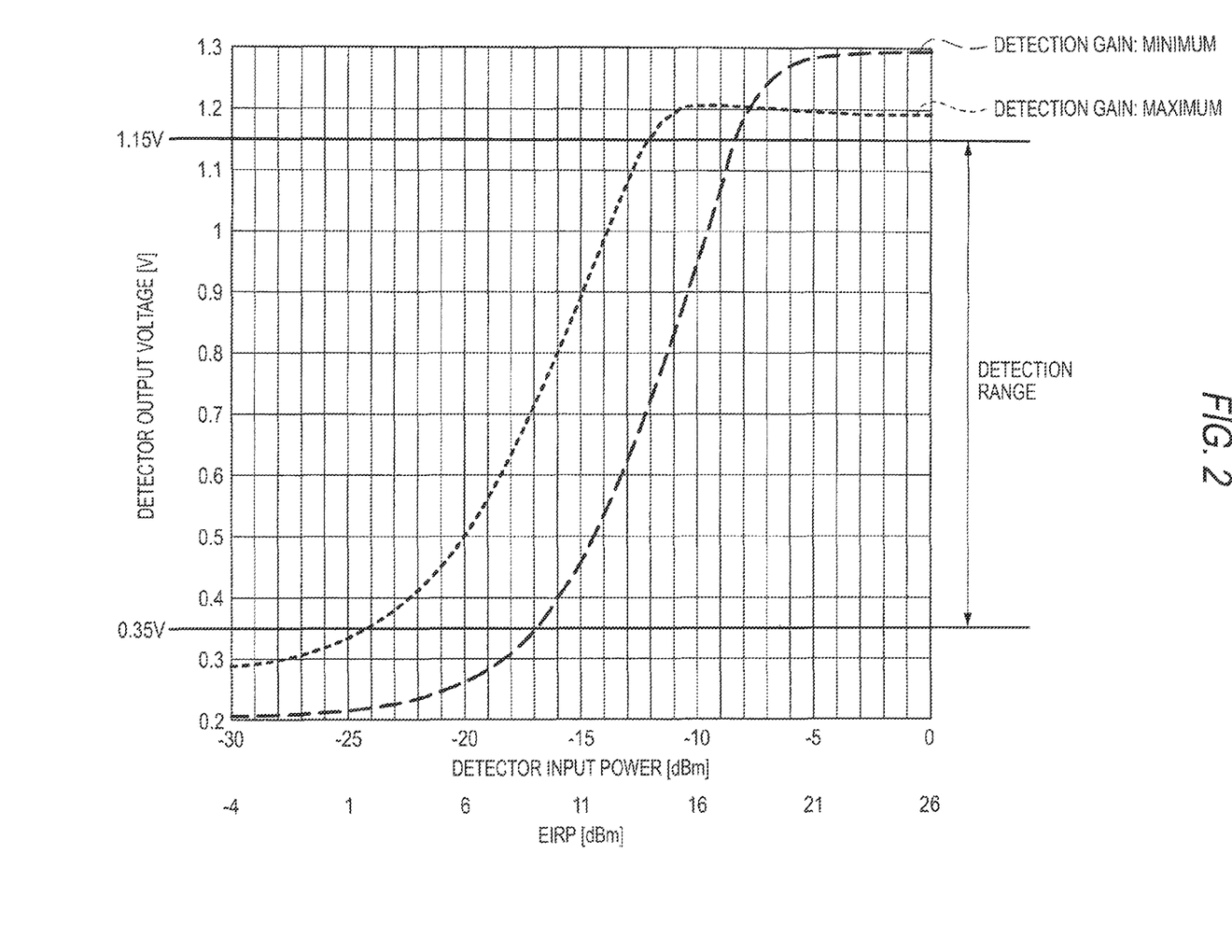
FIG. 2 is a graph showing the relationship between the input power and the output voltage in the case of the detector having the minimum detection gain and in the case of the detector having the maximum detection gain.

The detector 108 detects the analog high-frequency signal extracted by the coupler 101 and outputs the signal to the ADC 109. FIG. 2 is a graph showing the relationship between the input power [dBm] and the output voltage [V] in the case of the detector 108 having the minimum detection gain and in the case of the detector 108 having the maximum detection gain. In addition to the input power in the detector 108, the transmission power (referred to as the EIRP [dBm] of the antenna) of the high-frequency signal transmitted from the transmission antenna 100 having a gain of 6 dBi is also shown on the horizontal axis of FIG. 2.

The detection gain represents the ratio of the output voltage of the detector 108 to the input voltage corresponding to the input power. Since the detection gain of the detector 108 becomes different depending on the variation in a CMOS process, FIG. 2 shows the relationship between the input power and the output voltage in the case of the detector 108 having the maximum detection gain and in the case of the detector 108 having the minimum detection gain.

In FIG. 2, the range in which the output voltage of the detector 108 is determined uniquely depending on the input power of the detector 108, that is, the power of the high-frequency signal amplified by the power amplifier 102, is the operating range (detection range) of the detector 108. Hence, in the detector 108 shown in FIG. 2, in the case that the output voltage of the detector 108 is in a range of 0.35 to 1.15 V, that is, in the area of the detection range, the detector 108 can be used for automatic gain control (see FIG. 4) described later. On the other hand, in the area outside the detection range, the output voltage and the input power of the detector 108 are not in one-to-one correspondence, whereby it is difficult to use the area for the automatic gain control (see FIG. 4).

For example, in the case of the detector 108 having the minimum detection gain, the range of the input power (EIRP) of the detector 108 from −17 dBm (+9 dBm) to −8 dBm (+18 dBm) is the detection range. Furthermore, for example, in the case of the detector 108 having the maximum detection gain, the range of the input power of the detector 108 from −24 dBm (+2 dBm) to −12 dBm (+14 dBm) is the effective detection range.

The ADC 109 converts the output of the detector 108, that is, an analog output voltage, into a digital output voltage, and outputs the output voltage to the controller 111.

The controller 111 outputs the control signal S110 for generating the baseband signals to the digital modulation signal generator 110. On the basis of the values (refer to the following description) stored in the first nonvolatile memory 112 and the second nonvolatile memory 113 and the output power ADCOUT corresponding to the digital output voltage output from the ADC 109, the controller 111 generates the gain control signal S104 for setting the gain of the variable gain amplifiers 104a and 104b, and outputs the gain to the variable gain amplifiers 104a and 104b.

The comparator 116 compares the value TXADC_RDATA stored in the first nonvolatile memory 112 with the power ADCOUT corresponding to the digital output voltage output from the ADC 109. The value TXADC_RDATA is the desired value of the EIRP of the high-frequency signal to be transmitted from the wireless communication apparatus 200 and is written by the tester 114. Depending on the result of the comparison of the value TXADC_RDATA stored in the first nonvolatile memory 112 with the power ADCOUT corresponding to the digital output voltage output from the ADC 109, the comparator 116 increases the gain TXGAIN stored in the volatile memory 117.

The volatile memory 117 stores the gain TXGAIN of the variable gain amplifiers 104a and 104b. The gain TXGAIN stored in the volatile memory 117 is input to the switch 118 and the subtractor 119.

The switch 118 selects the gain TXGAIN stored in the volatile memory 117 or the output (the result of subtraction) of the subtractor 119 and outputs the gain or the output as the gain control signal S104 to the variable gain amplifiers 104a and 104b.

The subtractor 119 subtracts the offset value P_OFFSET stored in the second nonvolatile memory 113 from the gain TXGAIN stored in the volatile memory 117 and outputs the obtained value to the switch 118.

The first nonvolatile memory 112 stores the target value TXADC_RDATA of the EIRP of the high-frequency signal transmitted from the transmission antenna 100. A nonvolatile memory produced using, for example, the eFUSE production technology, is used as the first nonvolatile memory 112. As a result, the production cost of the first nonvolatile memory 112 can be reduced.

In the case that, for example, the output voltage of the detector 108 is the lower limit value (for example, 0.35 V, see FIG. 2) of the detection range and that the EIRP is larger than the upper limit value in the desired range of the transmission power, the second nonvolatile memory 113 stores the offset value P_OFFSET for reducing the EIRP by a predetermined amount. The offset value P_OFFSET is written using the tester 114. A nonvolatile memory produced using, for example, the eFUSE production technology, is used as the second nonvolatile memory 113. As a result, the production cost of the second nonvolatile memory 113 can be reduced.

The receiving antenna 115 receives the high-frequency signal transmitted from the transmission antenna 100 and outputs the signal to the tester 114.

The tester 114 holds the information about the desired range of the transmission power of the high-frequency signal to be transmitted from the wireless communication apparatus 200. In the following description, it is assumed that, for example, the lower limit value in the desired range of the transmission power is 6.5 dBm and that the upper limit value thereof is 9.5 dBm. The tester 114 measures the EIRP of the high-frequency signal output from the receiving antenna 115 and judges whether the EIRP is in the desired range of the transmission power. Depending on the result of the judgment, the tester 114 renews the contents of the first and second nonvolatile memories 112 and 113.

Figure 3:
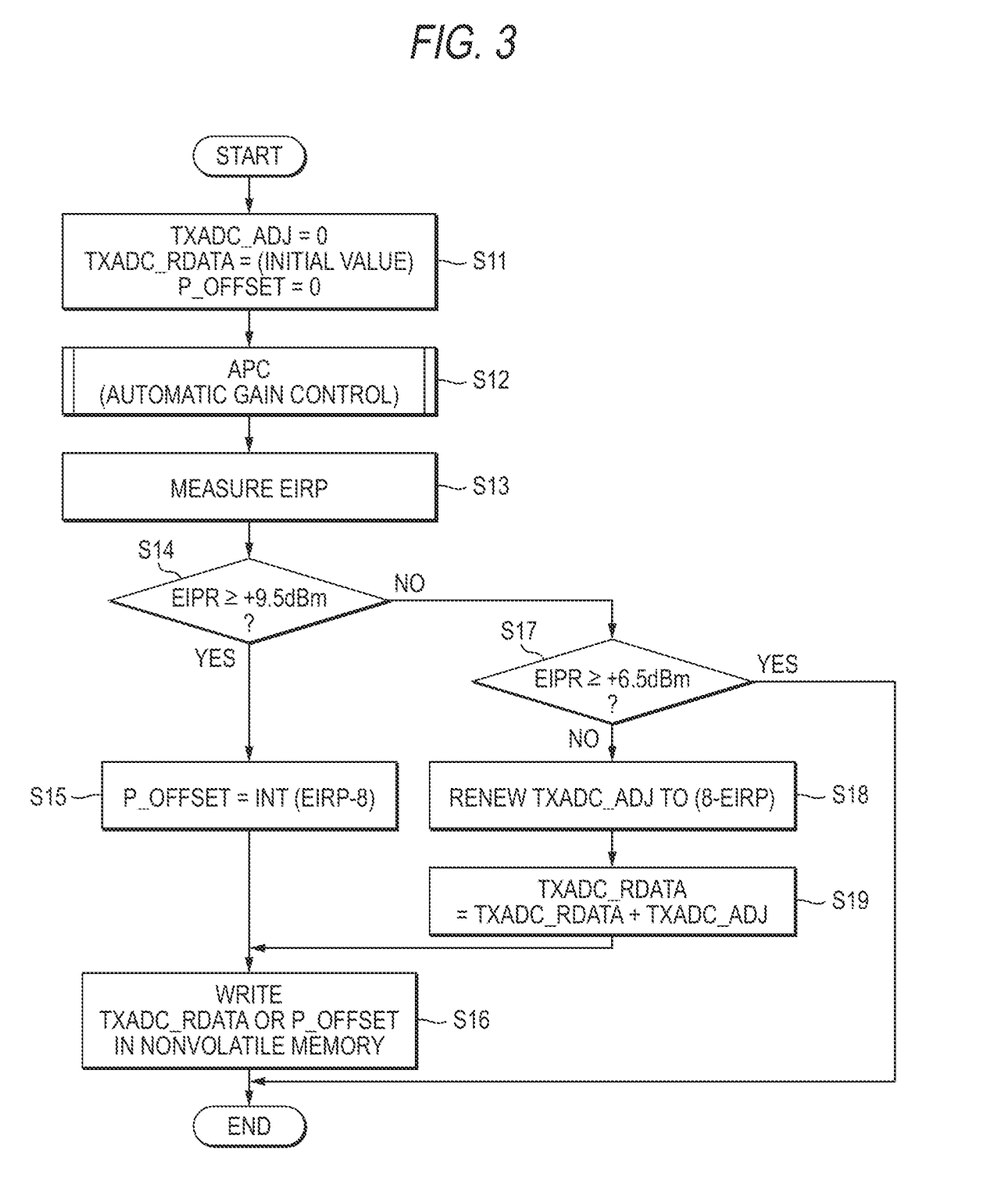
FIG. 3 is a flow chart illustrating the operation procedure for writing data in the first and second nonvolatile memories of the wireless communication apparatus according to this embodiment.
Figure 4:
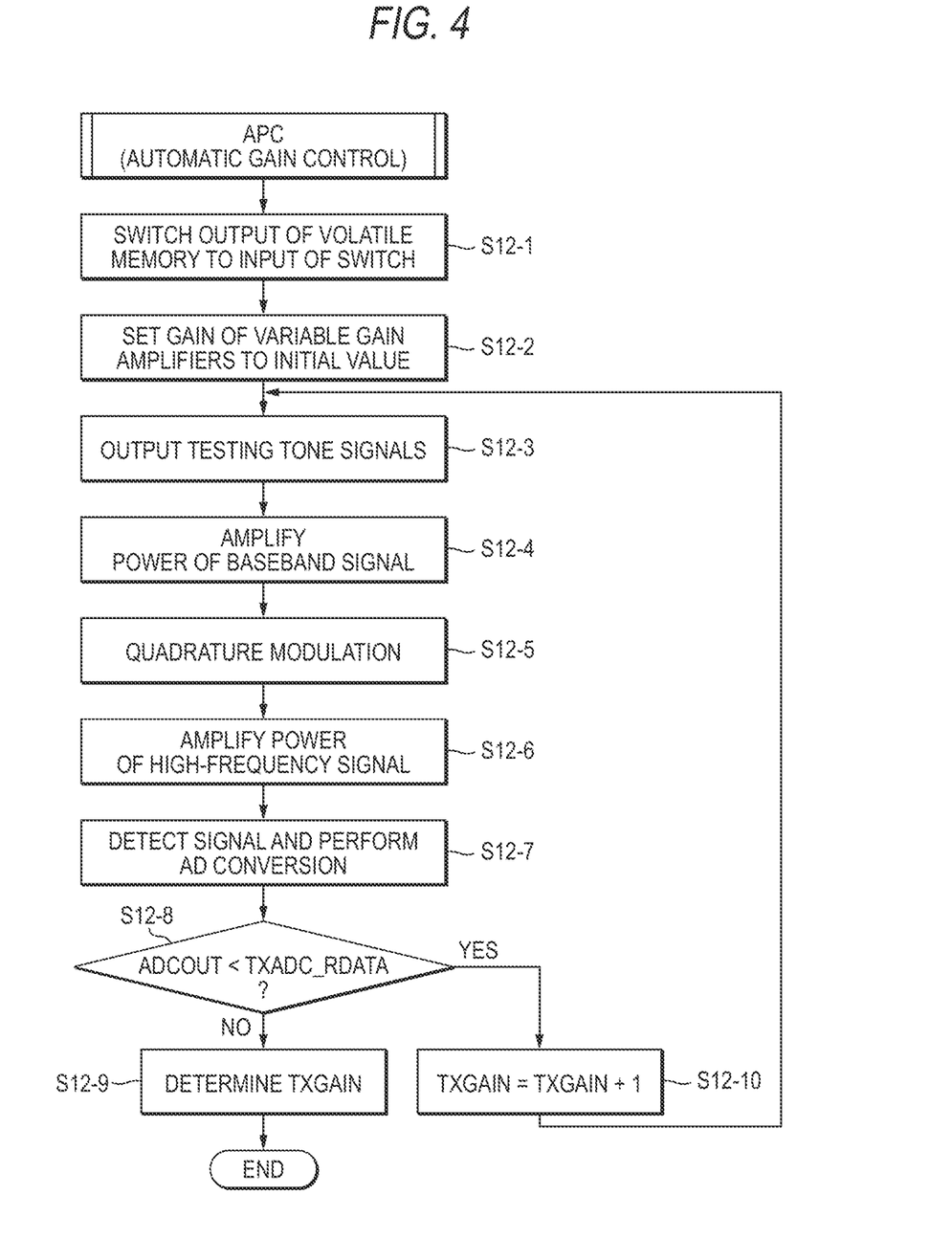
FIG. 4 is a flow chart illustrating the operation procedure of the APC (automatic gain control) of the wireless communication apparatus according to this embodiment.

Operation of the Tester 114 for Writing Data in the Respective Nonvolatile Memories Next, the operation of the tester 114 for writing data in the first and second nonvolatile memories 112 and 113 depending on the EIRP of the high-frequency signal transmitted from the wireless communication apparatus 200 will be described referring to FIGS. 3 and 4. FIG. 3 is a flow chart illustrating the operation procedure for writing data in the first and second nonvolatile memories 112 and 113 of the wireless communication apparatus 200 according to this embodiment. FIG. 4 is a flow chart illustrating the operation procedure of the APC (automatic gain control) of the wireless communication apparatus 200 according to this embodiment. The operations of the respective flow charts shown in FIGS. 3 and 4 will be carried out, for example, at the time of the shipment inspection of the wireless communication apparatus 200.

In FIG. 3, first, the tester 114 sets a variable TXADC_ADJ and the offset value P_OFFSET to 0 (zero) and sets the target value TXADC_RDATA of the EIRP to its initial value (at S11). The initial value of the target value TXADC_RDATA of the EIRP is an appropriate predetermined value prescribed beforehand by actual measurement or simulation.

After step S11, the wireless communication apparatus 200 carries out the APC (automatic gain control) (at S12). The APC in the wireless communication apparatus 200 will be herein described in detail referring to FIG. 4.

In FIG. 4, the controller 111 switches the input of the switch 118 to the output of the volatile memory 117 (at S12-1). The controller 111 reads the initial value of the gain of the variable gain amplifiers 104a and 104b, that is, the minimum gain TXGAIN, from the volatile memory 117, generates the gain control signal S104 for setting the gain of the variable gain amplifiers 104a and 104b, and outputs the signal to the variable gain amplifiers 104a and 104b. The variable gain amplifiers 104a and 104b set the gain TXGAIN of the variable gain amplifiers 104a and 104b to the initial value depending on the gain control signal S104 (at S12-2).

Furthermore, the controller 111 outputs the control signal S110 for generating the baseband signals to the digital modulation signal generator 110. On the basis of the control signal S110 output from the controller 111, the digital modulation signal generator 110 generates the baseband signals (for example, the testing tone signals), outputs the in-phase signal (I signal) of the baseband signals to the DAC 105a, and outputs the quadrature signal (Q signal) of the baseband signals to the DAC 105b (at S12-3).

The DAC 105a converts the digital in-phase signal output from the digital modulation signal generator 110 into the analog in-phase signal and outputs the signal to the variable gain amplifier 104a. The DAC 105b converts the digital quadrature signal output from the digital modulation signal generator 110 into the analog quadrature signal and outputs the signal to the variable gain amplifier 104b.

The variable gain amplifier 104a amplifies the in-phase signal output from the DAC 105a using the gain changed depending on the gain control signal S104, and outputs the amplified signal to the quadrature modulation section 103 (at S12-4). The variable gain amplifier 104b amplifies the quadrature signal output from the DAC 105b using the gain changed depending on the gain control signal S104, and outputs the amplified signal to the quadrature modulation section 103 (at S12-4).

The quadrature modulation section 103 performs quadrature modulation using the in-phase signal and the quadrature signal of the baseband signals output from the variable gain amplifiers 104a and 104b and the two local signals output from the 90-degree phase shifter 106 (at S12-5). The quadrature modulation section 103 generates a high-frequency signal (for example, a millimeter wave) by quadrature modulation and outputs the signal to the power amplifier 102.

The power amplifier 102 amplifies the power of the high-frequency signal output from the quadrature modulation section 103 and outputs the amplified signal to the transmission antenna 100 (at S12-6). The coupler 101 extracts part of the high-frequency signal amplified by the power amplifier 102 and outputs the part to the detector 108. The detector 108 detects the analog high-frequency signal extracted by the coupler 101 and outputs the signal to the ADC 109 (at S12-7). The ADC 109 converts the output of the detector 108, that is, an analog output voltage, into a digital output voltage, and outputs the output voltage to the controller 111 (at S12-7).

The controller 111 compares the initial value of the target value TXADC_RDATA of the EIRP set at step S11 with the power ADCOUT corresponding to the digital output voltage output from the ADC 109 (at S12-8). Upon judging that the power ADCOUT corresponding to the digital output voltage is not less than the initial value of the target value TXADC_RDATA of the EIRP (NO at S12-8), the controller 111 determines the gain TXGAIN of the variable gain amplifiers 104a and 104b set at step S12-2 (at S12-9). Consequently, the APC in the wireless communication apparatus 200 is completed.

On the other hand, upon judging that the power ADCOUT corresponding to the digital output voltage is less than the initial value of the target value TXADC_RDATA of the EIRP (YES at S12-8), the controller 111 increases the gain TXGAIN of the variable gain amplifiers 104a and 104b set at step S12-2 by 1 dB (at S12-10). After step S12-10, the controller 111 outputs the control signal S110 for generating the baseband signals to the digital modulation signal generator 110. In other words, the operation from step S12-3 to step S12-10 is repeated until the power ADCOUT corresponding to the digital output voltage becomes not less than the initial value of the target value TXADC_RDATA of the EIRP.

After the APC shown in FIG. 4, the tester 114 measures the EIRP of the high-frequency signal transmitted from the transmission antenna 100 (at S13). The tester 114 judges whether the EIRP measured at step S13 is in the desired range of the transmission power (at S14).

More specifically, the tester 114 judges whether the EIRP measured at step S13 is not less than the upper limit value (for example, 9.5 dBm) in the desired range of the transmission power (at S14). Upon judging that the EIRP is not less than the upper limit value (for example, 9.5 dBm) in the desired range of the transmission power (YES at S14), the tester 114 writes INT(EIRP-8), that is, the integer value of (EIRP-8), as the offset value P_OFFSET in the second nonvolatile memory 113 (at S15 and S16). It is noted that 8 dBm is an example of the center value (desired value) of the desired range of the transmission power.

Upon judging that the EIRP is less than the upper limit value (for example, 9.5 dBm) in the desired range of the transmission power (NO at S14), the tester 114 judges whether the EIRP is not less than the lower limit value (for example, 6.5 dBm) in the desired range of the transmission power (at S17).

Upon judging that the EIRP is not less than the lower limit value (for example, 6.5 dBm) in the desired range of the transmission power (YES at S17), the tester 114 does not change the initial value of the target value TXADC_RDATA of the EIRP set at step S11, and the operation shown in FIG. 3 is completed.

On the other hand, upon judging that the EIRP is less than the lower limit value (for example, 6.5 dBm) in the desired range of the transmission power (NO at S17), the tester 114 renews the variable TXADC_ADJ set to 0 (zero) at step S11 to (8-EIRP) (at S18). Furthermore, using the target value TXADC_RDATA of the EIRP having been set to the initial value at step S11, the tester 114 adds the initial value of the target value TXADC_RDATA of the EIRP to the variable TXADC_ADJ renewed at step S18 (at S19). The tester 114 writes the target value TXADC_RDATA of the EIRP, obtained as the result of the addition, in the first nonvolatile memory 112 (at S16). Hence, the operation shown in FIG. 3 is completed.

Transmission Power Control Method in the Wireless Communication Apparatus 200

Figure 5:
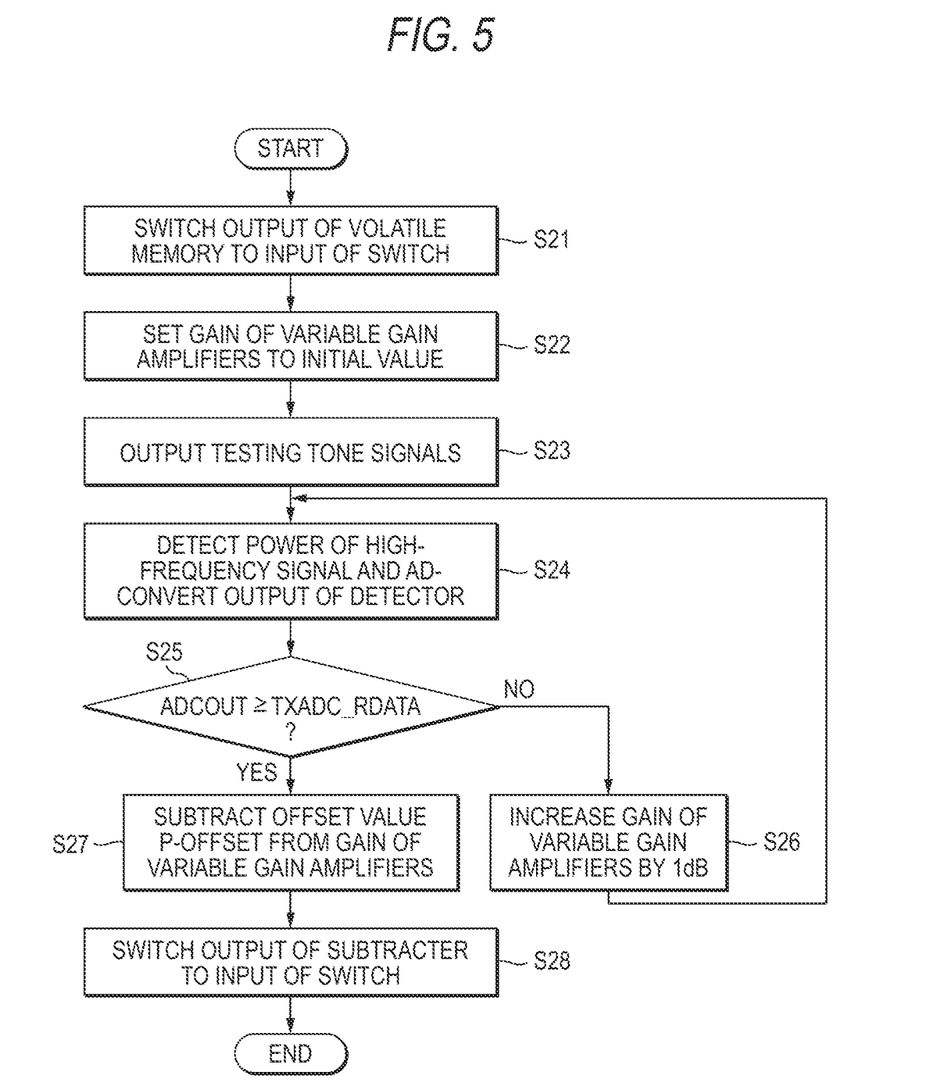
FIG. 5 is a flow chart illustrating the operation procedure for the APC (automatic gain control) at the time of the actual operation of the wireless communication apparatus according to this embodiment.

Next, the transmission power control method in the wireless communication apparatus 200 according to this embodiment will be described referring to FIG. 5. FIG. 5 is a flow chart illustrating the operation procedure for the APC (automatic gain control) at the time of the actual operation of the wireless communication apparatus 200 according to this embodiment.

In FIG. 5, the controller 111 switches the input of the switch 118 to the output of the volatile memory 117 (at S21). The controller 111 reads the initial value of the gain of the variable gain amplifiers 104a and 104b, that is, the minimum gain TXGAIN, from the volatile memory 117, generates the gain control signal S104 for setting the gain of the variable gain amplifiers 104a and 104b, and outputs the signal to the variable gain amplifiers 104a and 104b. The variable gain amplifiers 104a and 104b set the gain TXGAIN of the variable gain amplifiers 104a and 104b to the initial value depending on the gain control signal S104 (at S22).

Furthermore, the controller 111 outputs the control signal S110 for generating the baseband signals to the digital modulation signal generator 110. On the basis of the control signal S110 output from the controller 111, the] digital modulation signal generator 110 generates the baseband signals (for example, the testing tone signals), outputs the in-phase signal (I signal) of the baseband signals to the DAC 105a, and outputs the quadrature signal (Q signal) to the DAC 105b (at S23).

The DAC 105a converts the digital in-phase signal output from the digital modulation signal generator 110 into the analog in-phase signal and outputs the signal to the variable gain amplifier 104a. The DAC 105b converts the digital quadrature signal output from the digital modulation signal generator 110 into the analog quadrature signal and outputs the signal to the variable gain amplifier 104b.

The variable gain amplifier 104a amplifies the in-phase signal output from the DAC 105a using the gain changed depending on the gain control signal S104, and outputs the amplified signal to the quadrature modulation section 103. The variable gain amplifier 104b amplifies the quadrature signal output from the DAC 105b using the gain changed depending on the gain control signal S104, and outputs the amplified signal to the quadrature modulation section 103.

The quadrature modulation section 103 performs quadrature modulation using the in-phase signal and the quadrature signal of the baseband signals output from the variable gain amplifiers 104a and 104b and the two local signals output from the 90-degree phase shifter 106. The quadrature modulation section 103 generates a high-frequency signal (for example, a millimeter wave) by quadrature modulation and outputs the signal to the power amplifier 102.

The power amplifier 102 amplifies the power of the high-frequency signal output from the quadrature modulation section 103 and outputs the amplified signal to the transmission antenna 100. The coupler 101 extracts part of the high-frequency signal amplified by the power amplifier 102 and outputs the part to the detector 108. The detector 108 detects the analog high-frequency signal extracted by the coupler 101 and outputs the signal to the ADC 109 (at S24). The ADC 109 converts the output of the detector 108, that is, an analog output voltage, into a digital output voltage and outputs the output voltage to the controller 111 (at S24).

The controller 111 compares the target value TXADC_RDATA of the EIRP written in the first nonvolatile memory 112, for example, at the time of the shipment inspection, with the power ADCOUT corresponding to the digital output voltage output from the ADC 109 at step S24 (at S25). Upon judging that the power ADCOUT corresponding to the digital output voltage is less than the target value TXADC_RDATA of the EIRP (NO at S25), the controller 111 increases the gain TXGAIN of the variable gain amplifiers 104a and 104b stored in the volatile memory 117 by 1 dB (at S26). After step S2, the operation of the wireless communication apparatus 200 returns to step S24.

Upon judging that the power ADCOUT corresponding to the digital output voltage output from the ADC 109 at step S24 is not less than the target value TXADC_RDATA of the EIRP (YES at S25), the controller 111 reads the offset value P_OFFSET written by the tester 114 at the time of the shipment inspection from the second nonvolatile memory 113.

Moreover, the controller 111 subtracts the offset value P_OFFSET from the gain of the variable gain amplifiers 104a and 104b stored in the volatile memory 117 (at S27) and switches the input of the switch 118 from the output of the volatile memory 117 to the output of the subtractor 119 (at S28). Hence, the controller 111 generates the gain control signal S104 for setting the gain subjected to the subtraction at the subtractor 119 and outputs the signal to the variable gain amplifiers 104a and 104b. The variable gain amplifiers 104a and 104b can set the gain of the respective variable gain amplifiers 104a and 104b depending on the gain control signal S104.

Consequently, in the wireless communication apparatus 200 according to this embodiment, for example, at the time of the shipment inspection, the target value TXADC_RDATA of the EIRP of the high-frequency signal is set to its initial value, and the gain of the variable gain amplifiers 104a and 104b is determined by the APC (automatic gain control). Furthermore, in the wireless communication apparatus 200, depending on whether the EIRP of the high-frequency signal, obtained by using the determined gain, is in the desired range of the transmission power, the target value TXADC_RDATA of the EIRP and the offset value P_OFFSET for decreasing the EIRP by the predetermined amount are calculated and written in the first and second nonvolatile memories 112 and 113.

Furthermore, in the wireless communication apparatus 200, for example, at the time of its actual operation, the gain of the variable gain amplifiers 104a and 104b is adjusted so that the output power ADCOUT corresponding to the output voltage of the ADC 109 becomes the target value TXADC_RDATA of the EIRP of the high-frequency signal written in the first nonvolatile memory 112. Moreover, in the wireless communication apparatus 200, in the case that the output power ADCOUT corresponding to the output voltage of the ADC 109 is larger than the target value TXADC_RDATA of the EIRP, the gain of the variable gain amplifiers 104a and 104b stored in the volatile memory 117 is subtracted by the offset value P_OFFSET stored in the second nonvolatile memory 113.

Consequently, in the wireless communication apparatus 200 according to this embodiment, for example, at the time of the shipment inspection, the gain of the variable gain amplifiers 104a and 104b can be set so that the measurement result of the EIRP of the high-frequency signal becomes the target value TXADC_RDATA in the APC (automatic gain control). In the wireless communication apparatus 200, in the case that the EIRP of the high-frequency signal is not less than the upper limit value in the desired range of the transmission power, the offset value P_OFFSET for decreasing the EIRP of the high-frequency signal by the predetermined amount can be calculated. Moreover, in the wireless communication apparatus 200, in the case that the EIRP of the high-frequency signal is less than the lower limit value in the desired range of the transmission power, the target value of the EIRP of the high-frequency signal can be adjusted.

What's more, in the case that the output voltage of the detector 108 having the minimum detection gain at the time of the shipment inspection is 0.35 V and that the EIRP of the high-frequency signal is more than 11 dBm (for example, 12 dBm), the range is outside the detection range of the detector 108 (see FIG. 2); hence, the output voltage with respect to the input power at the detector 108 is not determined uniquely, and it is difficult to decrease the EIRP of the high-frequency signal.

In the wireless communication apparatus 200, even in the case that the output voltage of the detector 108 having the minimum detection gain at the time of the shipment inspection is 0.35 V and that the EIRP of the high-frequency signal is more than 11 dBm, in the case that the target value TXADC_RDATA of the EIRP of the high-frequency signal is set to 8 dBm, the offset value P_OFFSET can be subtracted from the gain of the variable gain amplifiers 104a and 104b at the time of the actual operation; hence, the transmission power of the high-frequency signal can be decreased from 11 dBm by 3 dBm, for example.

Still further, in the wireless communication apparatus 200, for example, at the time of the shipment inspection, the target value TXADC_RDATA of the EIRP of the high-frequency signal is set depending on the EIRP of the high-frequency signal transmitted from the transmission antenna 100; hence, even in the case that the gain of the transmission antenna 100 varies, the EIRP of the high-frequency signal can be made constant. Consequently, in the wireless communication apparatus 200, in the case of wireless communication dealing with high-frequency signals, even if the gain of the antenna varies, the EIRP of the antenna can be made constant.

Although various embodiments have been described above referring to the drawings, it is needless to say that the present disclosure is not limited to the embodiments. It is obvious that those skilled in the art can devise various alterations or modifications within the scope set forth in the claims, and it is understood that these belong to the technical scope of the present disclosure as a matter of course.

The value in the desired range of the transmission power used in the above-mentioned embodiments is used as an example and does not restrict the desired range of the transmission power.

In addition, in the wireless communication apparatus 200, a comparator may be used instead of the ADC 109.

Furthermore, although the offset value P_OFFSET is used to decrease the gain of the variable gain amplifiers 104a and 104b in the above-mentioned embodiments, the offset value P_OFFSET may be used to increase the gain of the variable gain amplifiers 104a and 104b.

The present application is based on Japanese Patent Application (JP-2013-23451) filed on Feb. 8, 2013, the contents of which are hereby incorporated by reference.

INDUSTRIAL APPLICABILITY

The present disclosure is useful as a wireless communication apparatus and a transmission power control method for making the EIRP of an antenna constant even if the gain of the antenna varies in wireless communication dealing with high-frequency signals.

DESCRIPTION OF REFERENCE NUMERALS AND SIGNS 100 transmission antenna
101 coupler
102 power amplifier
103 quadrature modulation section
104a, 104b variable gain amplifier
105a, 105b DAC
106 90-degree phase shifter
107 local oscillator
108 detector
109 ADC
110 digital modulation signal generator
111 controller
112, 113 nonvolatile memory
114 tester
115 receiving antenna
116 comparator
117 volatile memory
118 switch
119 subtractor
200 wireless communication apparatus

What is claimed is:

1. A wireless communication apparatus comprising:
   a variable gain amplifier that amplifies a baseband signal;
   a quadrature modulator that quadrature-modulates the amplified baseband signal to generate a high-frequency signal;
   a power amplifier that amplifies the generated high-frequency signal;
   a transmitting antenna that transmits the amplified high-frequency signal;
   a detector that generates a detection signal obtained by detecting the amplified high-frequency signal;
   a receiving antenna that receives the transmitted amplified high-frequency signal by the transmitting antenna and outputs as a received signal;
   a first nonvolatile memory that stores a value of a desired transmission power of the high-frequency signal to be transmitted from the transmitting antenna, the value being set based on the received signal;
   a second nonvolatile memory that stores a gain adjustment value for adjusting a gain of the variable gain amplifier in the case that the detection signal is equal to or greater than the value of the desired transmission power; and
   a controller that increases the gain of the variable gain amplifier in the case that the detection signal is smaller than the value of the desired transmission power, and subtracts the gain adjustment value from the gain of the variable gain amplifier in the case that the detection signal is equal to or greater than the value of the desired transmission power.

2. The wireless communication apparatus according to claim 1, wherein the controller adjusts the gain of the variable gain amplifier so that the output of the detector is equal to the value of the desired transmission power stored in the first nonvolatile memory.

3. A transmission power control method for use in a wireless communication apparatus for transmitting a high-frequency signal amplified by a variable gain amplifier from an antenna and in a tester for testing a transmission power of the high-frequency signal transmitted from the antenna,
   wherein the wireless communication apparatus has a first nonvolatile memory and a second nonvolatile memory;
   wherein the tester stores a desired range of the transmission power of the high-frequency signal to be transmitted from the antenna;
   wherein in the case that the transmission power of the high-frequency signal transmitted from the antenna after the gain of variable gain amplifier has been adjusted is smaller than the desired range of the transmission power, the tester writes an adjustment value for increasing the transmission power of the high-frequency signal in the first nonvolatile memory;
   wherein in the case that the transmission power of the high-frequency signal transmitted from the antenna after the gain of variable gain amplifier has been adjusted is equal to or greater than the desired range of the transmission power, the tester writes an adjustment value for decreasing the transmission power of the high-frequency signal in the second nonvolatile memory; and
   wherein in the case that the transmission power of the high-frequency signal transmitted from the antenna after the gain of the variable gain amplifiers has been adjusted is in the desired range of the transmission power, the tester does not write in the first nonvolatile memory and in the second nonvolatile memory.

* * * * *